United States Patent
Wu et al.

(10) Patent No.: US 10,387,602 B2
(45) Date of Patent: Aug. 20, 2019

(54) METHOD FOR GENERATING MASKS FOR MANUFACTURING OF A SEMICONDUCTOR STRUCTURE AND METHOD FOR MANUFACTURING A SEMICONDUCTOR STRUCTURE USING THE SAME

(71) Applicant: UNITED MICROELECTRONICS CORP., Hsinchu (TW)

(72) Inventors: Tsung-Yeh Wu, Tainan (TW); Chia-Wei Huang, Kaohsiung (TW); Yung-Feng Cheng, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 86 days.

(21) Appl. No.: 15/879,788

(22) Filed: Jan. 25, 2018

(65) Prior Publication Data
US 2019/0228127 A1 Jul. 25, 2019

(51) Int. Cl.
*G06F 17/50* (2006.01)
*H01L 21/02* (2006.01)
*H01L 21/033* (2006.01)

(52) U.S. Cl.
CPC .... *G06F 17/5072* (2013.01); *H01L 21/02019* (2013.01); *H01L 21/0337* (2013.01)

(58) Field of Classification Search
CPC .................................................. G06F 17/5072
USPC ........................................................ 716/55
See application file for complete search history.

(56) References Cited

U.S. PATENT DOCUMENTS

| | | | |
|---|---|---|---|
| 7,556,915 B2 | 7/2009 | Lauchlan | |
| 8,111,921 B2 | 2/2012 | Hsu et al. | |
| 8,347,240 B2* | 1/2013 | Agarwal | G03F 1/70 378/35 |
| 8,612,902 B1* | 12/2013 | Agarwal | G03F 7/70433 716/54 |
| 2010/0175040 A1 | 7/2010 | Meiring et al. | |
| 2014/0331191 A1* | 11/2014 | Wu | G06F 17/5081 716/53 |
| 2015/0040081 A1* | 2/2015 | Huang | G03F 1/36 716/53 |

* cited by examiner

*Primary Examiner* — Suresh Memula
(74) *Attorney, Agent, or Firm* — WPAT, PC

(57) ABSTRACT

A method for generating masks for manufacturing of a semiconductor structure comprises the following steps. A design pattern for features to be formed on a substrate is divided into a first set of patterns and a second set of patterns. The first set of patterns comprises a first pattern corresponding to a first feature, the second set of patterns comprises two second patterns corresponding to two second features, and the first feature will be arranged between the two second features when the features are formed on a substrate. Two assist feature patterns are added into the first set of patterns. The two assist feature patterns are arranged in locations corresponding to the two second features, respectively. A first mask is generated based on the first set of patterns with the assist feature patterns. A second mask is generated based on the second set of patterns.

13 Claims, 12 Drawing Sheets

METHOD FOR GENERATING MASKS FOR MANUFACTURING OF A SEMICONDUCTOR STRUCTURE AND METHOD FOR MANUFACTURING A SEMICONDUCTOR STRUCTURE USING THE SAME

TECHNICAL FIELD

This disclosure relates to a method for generating masks for manufacturing of a semiconductor structure and a method for manufacturing a semiconductor structure using the same.

BACKGROUND

As the sizes and spaces of features in a semiconductor structure decrease, it becomes harder to form the densely arranged features. One of the reasons is the resolution limitation of lithography processes. To solve this problem, multiple patterning technologies, such as double patterning technology, are proposed. An example is pitch splitting. The densely arranged features are divided into two interleaving sets, and the two sets of the features are formed using two separate masks. More specifically, one half of the features are formed using one of the masks. The other half of the features then are formed using the other one of the masks in a manner that each of these features is located between two previously formed features. As such, the densely arranged features can be formed by less densely arranged patterns on the masks, wherein the pitch of which is twice of the pitch of the features to be formed.

SUMMARY

This disclosure provides a method for generating masks for manufacturing of a semiconductor structure, wherein the masks can be used in a manufacturing method applying double patterning technology. This method may also be referred to as a mask generation method in the disclosure. This disclosure also provides a method for manufacturing a semiconductor structure, wherein the mask generation method can be applied. This method may also be referred to as a manufacturing method in the disclosure.

According to some embodiments, a method for generating masks for manufacturing of a semiconductor structure comprises the following steps. First, a design pattern for features to be formed on a substrate is provided to a processor. The design pattern is divided into a first set of patterns and a second set of patterns by the processor. The first set of patterns comprises a first pattern corresponding to a first feature of the features to be formed, the second set of patterns comprises two second patterns corresponding to two second features of the features to be formed, and the first feature will be arranged between the two second features when the features are formed on the substrate. Then, two assist feature patterns are added into the first set of patterns by the processor. The two assist feature patterns are arranged in locations corresponding to the two second features, respectively. A first mask is generated based on the first set of patterns with the assist feature patterns by the processor. A second mask is generated based on the second set of patterns by the processor.

According to some embodiments, a method for manufacturing a semiconductor structure comprises forming features on a substrate. The formation comprises the following steps. First, the features to be formed are divided into a first set and a second set, wherein a first feature of the first set is arranged between two second features of the second set. Then, the first feature is formed in a desired location for the first feature and two assist features are formed in desired locations for the two second features, respectively, using a first mask. The two second features are formed in the desired locations for the two second features using a second mask.

Figure 1:
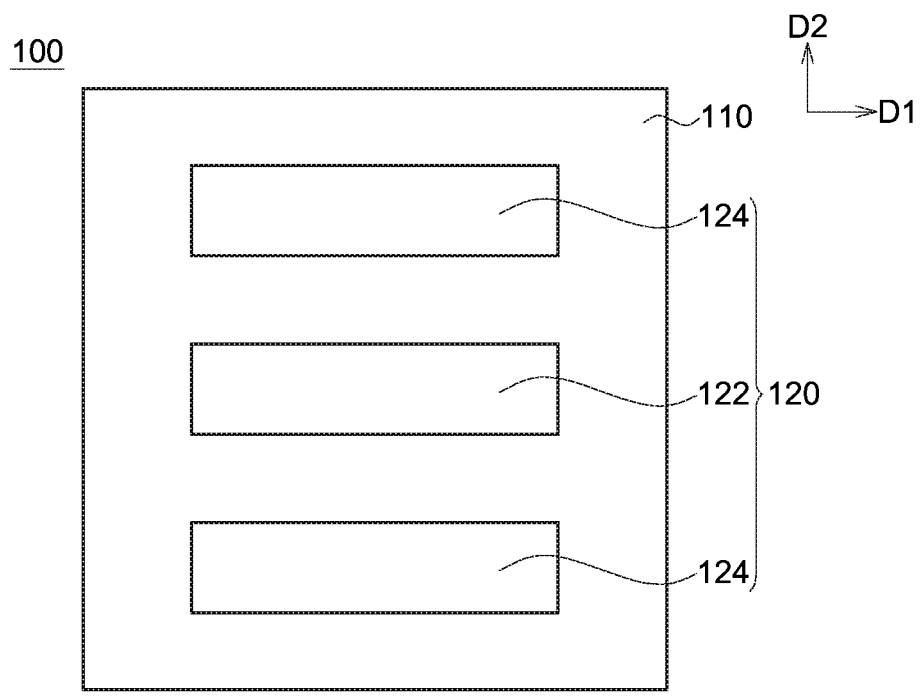
FIG. 1 shows an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, elements in the figures may not be drawn to scale, and some elements and/or reference numerals may be omitted. In embodiments in this disclosure, when a particular number of elements are illustrated, the embodiments do not exclude the situations in which more elements are included. For example, when an indicated element is described to be included in a structure, the structure may comprise one, two, or even more the indicated elements. In addition, it is contemplated that elements, characteristics, and the like of one embodiment may be beneficially incorporated in another embodiment without further recitation.

Referring to FIG. 1, an exemplary semiconductor structure 100 involved in this disclosure is shown. The semiconductor structure 100 comprises a substrate 110 and features 120 formed on the substrate 110. The features 120 formed on the substrate 110 extend along a first direction D1 and are arranged along a second direction D2 different from the first direction D1, such as perpendicular to the first direction D1 as shown in FIG. 1. The features 120 may be, but not limited to, protruding structures on the substrate 110, trenches in the substrate 110, or the like.

According to some embodiments, the features 120 comprise a first set of features and a second set of features. More specifically, the first set of features comprises a first feature 122, the second set of features comprises two second features 124, and the first feature 122 is arranged between the two second features 124, as shown in FIG. 1.

The features 122 and 124 may be substantially the same. Here, it means that the features 122 and 124 provide similar function and at least have substantially the same configuration in the concerned area. They may be completely the same. Alternatively, they may be somewhat different. For example, the features 122 and 124 may be conductive lines transferring different signals, and/or features 122 and 124 may turn to another direction in different locations.

Figure 2:
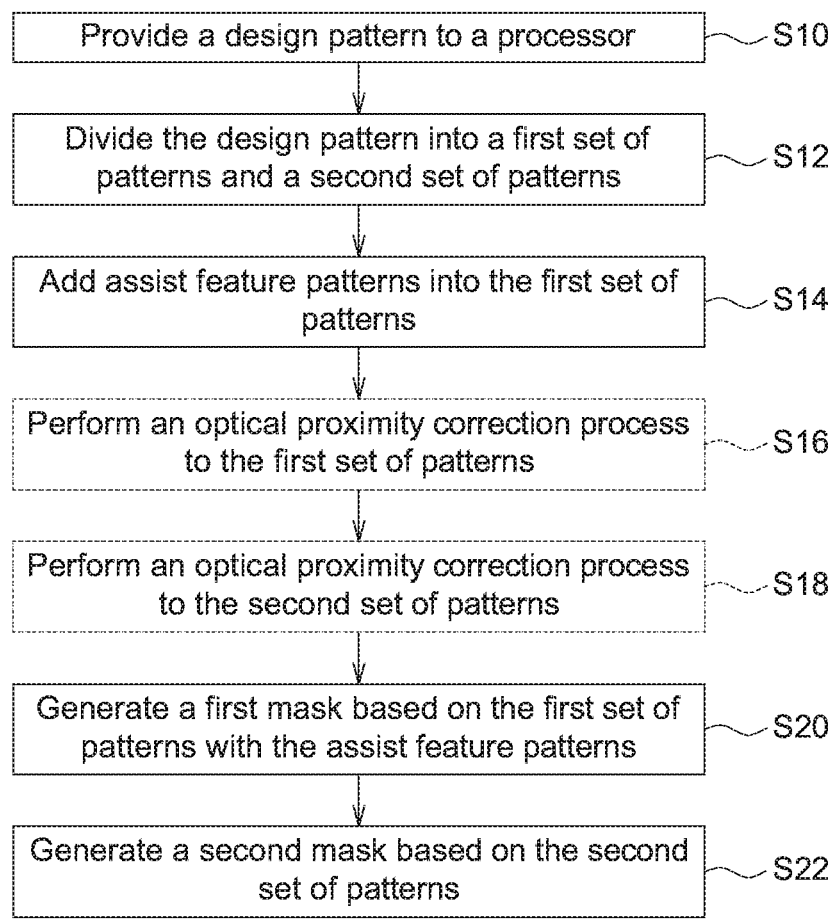
FIG. 2 shows the flow diagram of an exemplary method for generating masks for manufacturing of a semiconductor structure according to embodiments.
Figure 3A:
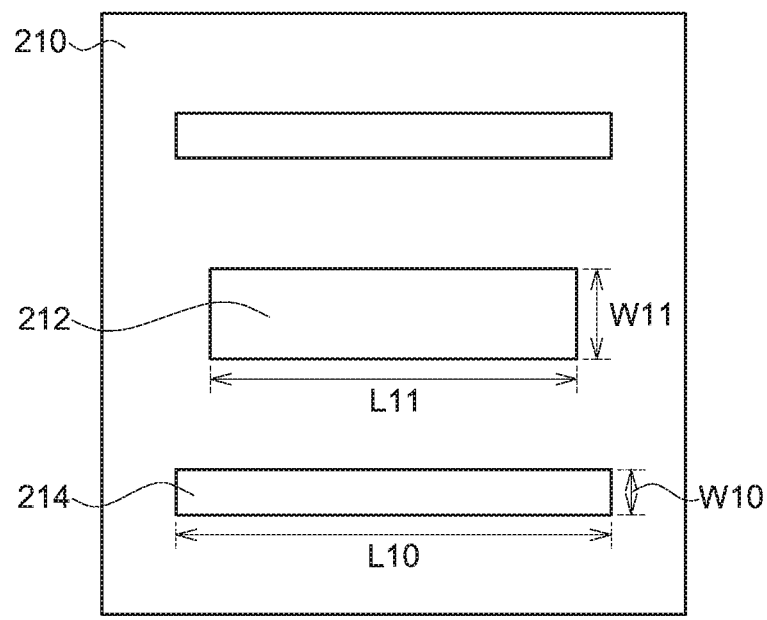
FIGS. 3A-3B show an exemplary pair of masks generated by a mask generation method according to embodiments.
Figure 3B:
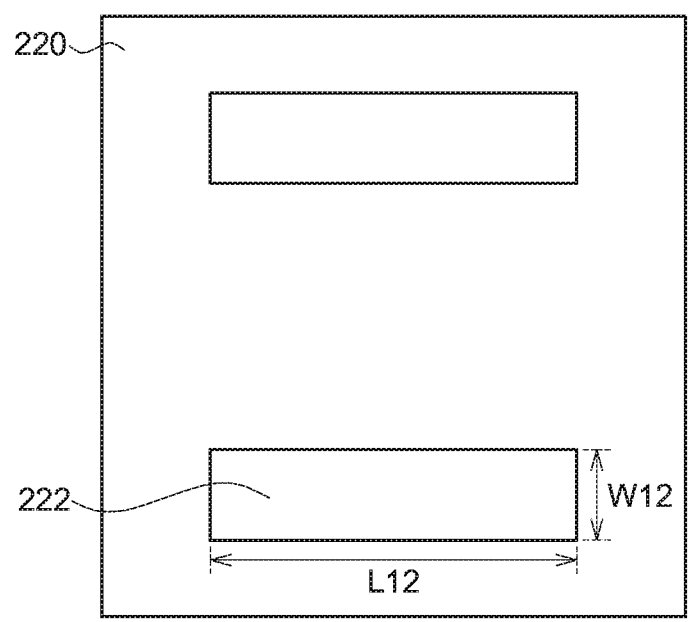

Now the description is directed to an exemplary method for generating masks for manufacturing of a semiconductor structure according to embodiments with reference to FIG. 2 and FIGS. 3A-3B, wherein the masks can be used to form the semiconductor structure 100 as shown in FIG. 1. FIG. 2 shows a flow diagram. FIGS. 3A-3B show an exemplary pair of masks generated by the method. It is contemplated that the steps described herein may be exchanged, combined, and/or modified at any other suitable manner, while it is needed.

Referring to FIG. 2, in step S10, a design pattern for features 120 to be formed on a substrate 110 is provided to a processor (not shown).

In step S12, the design pattern is divided into a first set of patterns and a second set of patterns by the processor. The first set of patterns comprises a first pattern (212) corresponding to a first feature 122 of the features 120 to be formed. The second set of patterns comprises two second patterns (222) corresponding to two second features 124 of the features 120 to be formed. The first feature 122 will be arranged between the two second features 124 when the features 120 are formed on the substrate 110, as shown in FIG. 1.

In step S14, two assist feature patterns (214) are added into the first set of patterns by the processor. The two assist feature patterns (214) are arranged in locations corresponding to the two second features 124, respectively. In some embodiments, a length of the assist feature patterns is larger than a length of the first pattern. In some embodiments, a width of the assist feature patterns is smaller than a width of the first pattern.

Before generating the pair of masks, some optional steps may be performed. For example, in the flow diagram of FIG. 2, in step S16, an optical proximity correction (OPC) process to the first set of patterns is performed by the processor, and in step S18, an OPC process to the second set of patterns is performed by the processor. According to some embodiments, the OPC processes as in FIG. 2, additions of other sub-resolution assist feature (SRAF) patterns and/or assist feature patterns, verifying processes, and/or other suitable processes for the first and second set of patterns may be individually chosen to be performed as needed.

Then, in step S20, a first mask (210) based on the first set of patterns with the assist feature patterns (214) is generated by the processor. In step S22, a second mask (220) based on the second set of patterns is generated by the processor.

Referring to FIGS. 3A-3B, a pair of masks generated by such method are shown, wherein FIG. 3A shows the first mask 210, and FIG. 3B shows the second mask 220. The first mask 210 comprises a first pattern 212 and two assist feature patterns 214. The second mask 220 comprises two second patterns 222. The assist feature patterns 214 are arranged at locations corresponding to the second patterns 222 and thereby corresponding to the second features 124 in FIG. 1. The assist feature patterns 214 have a length L10 and a width W10. The first pattern 212 has a length L11 and a width W11. The second patterns 222 have a length L12 and a width W12, which are substantially the same as the length L11 and the width W11 of the first pattern 212. As shown in FIG. 3A, a length L10 of the assist feature patterns 214 may be larger than a length L11 of the first pattern 212. A width W10 of the assist feature patterns 214 may be smaller than a width W11 of the first pattern 212, such as be about ¼ to ½ of the width W11 of the first pattern 212.

The arrangement of the assist feature patterns 214 is beneficial for the process window and line width roughness (LWR) for the first feature 122, particularly in a situation that no other first feature 122 is to be formed in the concerned area of the substrate 110 and thereby only one first pattern 212 is arranged in the corresponding area of the first mask 210. As such, it is not needed to widen the first pattern 212 itself for achieving a larger process window and other benefits. Such widening of the first pattern 212 may lead to an undesired widening of the first feature 122 and thereby shortage between the first feature 122 and a second feature 124 formed adjacent to the first feature 122. In addition, since the assist feature patterns 214 are arranged at locations corresponding to the second features 124, the features formed thereby can be controlled at the process window for the second features 124. According to some embodiments, a longer length L10 of the assist feature patterns 214 can ensure the benefit of the process window for the first feature 122 along its whole length. According to some embodiments, a narrower width W10 of the assist feature patterns 214 can make corresponding features narrower and shallower than the second features 124, and thereby ensure they are controlled at the process window for the second features 124 and will not affect the function and performance of the final structure.

It can be understood that the first mask 210 and the second mask 220 may comprise the whole first set of patterns and the whole second set of patterns, respectively. In other words, patterns other than those shown in FIG. 3A and FIG. 3B may be included in the first mask 210 and the second mask 220.

Figure 4A:
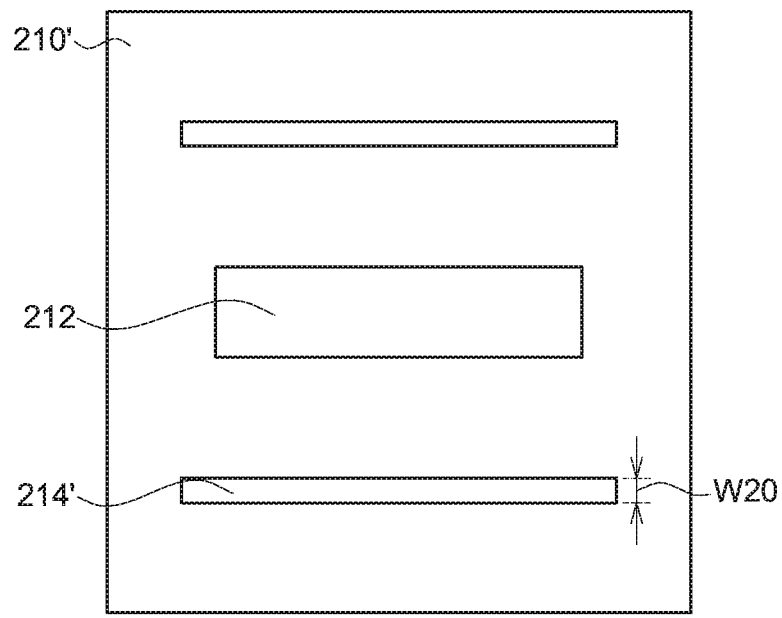
FIGS. 4A-4B show a pair of masks for comparison with the masks of FIGS. 3A-3B.
Figure 4B:
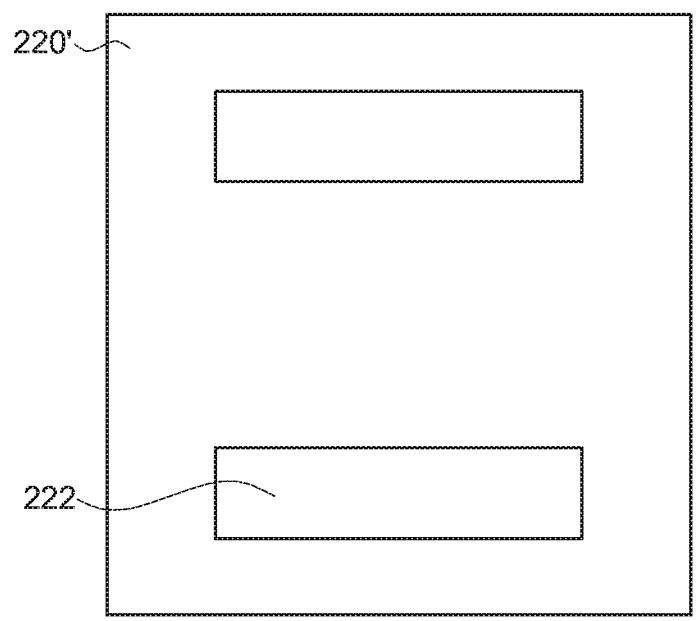

Referring to FIGS. 4A-4B, another pair of masks are shown, wherein FIG. 4A shows a first mask 210', and FIG. 4B shows a second mask 220'. Rather than the assist feature patterns 214 arranged at locations corresponding to the second patterns 222, the first mask 210' uses SRAF patterns 214' arranged at locations outside the locations corresponding to the second patterns 222. The SRAF patterns 214' have a width W20 narrower smaller than the width W10 of the assist feature patterns 214, and will not form a feature on the substrate 110 even after the lithography process. The arrangement of the SRAF patterns 214' is also beneficial for the process window and LWR for the first feature 122. However, compared to the first mask 210', the first mask 210 according to embodiments provides a larger process window and an improved resolution for the lithography process and a better LWR for the first feature 122 because the assist feature patterns 214 wider than the SRAF patterns 214' are used. The second mask 220' is substantially the same as the second mask 220.

In some embodiments, to provide a better compatibility with some process flows, two sets of patterns to form a pair of masks as shown in FIGS. 4A-4B may be provided in advance, and then be adjusted to form the pair of masks according to embodiments as shown in FIGS. 3A-3B. In such situations, the step S14, i.e., adding assist feature patterns into the first set of patterns, may comprise adding SRAF patterns arranged at initial locations outside locations corresponding to the second patterns, shifting the SRAF patterns from the initial locations to the locations corresponding to the second patterns, and widening the SRAF patterns to form the assist feature patterns.

Figure 5:
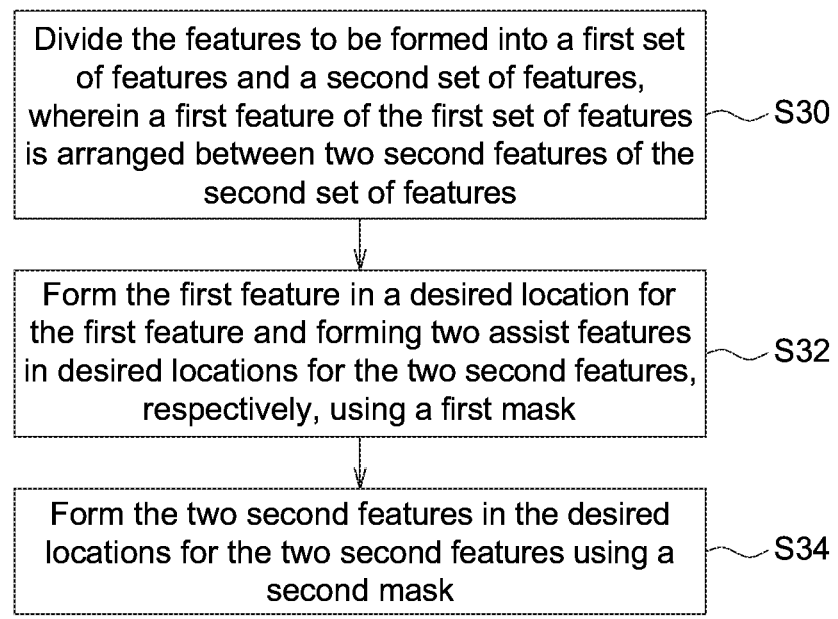
FIG. 5 shows the flow diagram of an exemplary method for manufacturing a semiconductor structure according to embodiments.

Now the description is directed to an exemplary method for manufacturing a semiconductor structure according to embodiments with reference to FIG. 5 and FIGS. 6A-6B to FIGS. 12A-12C. FIG. 5 shows a flow diagram, particularly for a step of forming features 120 on a substrate 110 in the manufacturing method. FIGS. 6A-6B to FIGS. 12A-12C show various stages of an exemplary semiconductor structure formed by a manufacturing method according to embodiments, wherein the figures indicated by "B" illustrates a cross-sectional view taken along the line B-B' in the corresponding figures indicated by "A", and the figures indicated by "C" illustrates a cross-sectional view taken along the line C-C' in the corresponding figures indicated by "A". In FIGS. 6A-6B to FIGS. 12A-12C, the features 120 to be formed are exemplarily illustrated as trenches. It is contemplated that the steps described herein may be exchanged, combined, and/or modified at any other suitable manner, while it is needed.

Referring to FIG. 5, in step S30, the features 120 to be formed is divided into a first set of features 120 and a second set of features 120, wherein a first feature 122 of the first set of features 120 is arranged between two second features 124 of the second set of features 120, as shown in FIG. 1.

In step S32, the first feature 122 is formed in a desired location for the first feature 122 and two assist features 112 are formed in desired locations for the two second features 124, respectively, using a first mask 210 as shown in FIG. 3A.

Figure 6A:
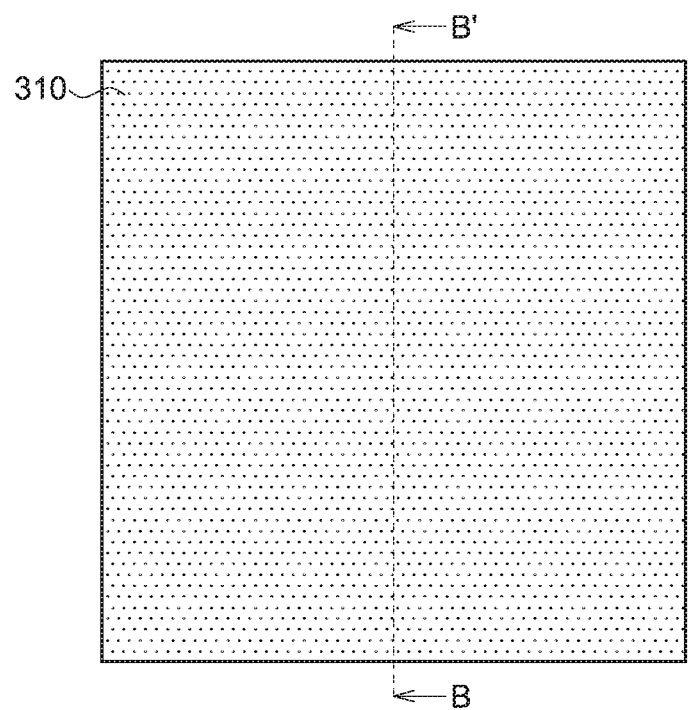
FIGS. 6A-6B to FIGS. 12A-12C show various stages of an exemplary semiconductor structure formed by a manufacturing method according to embodiments.
Figure 6B:
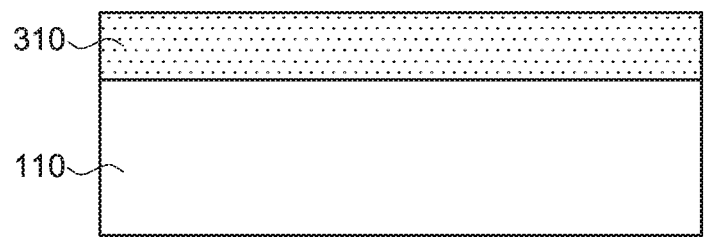
Figure 7A:
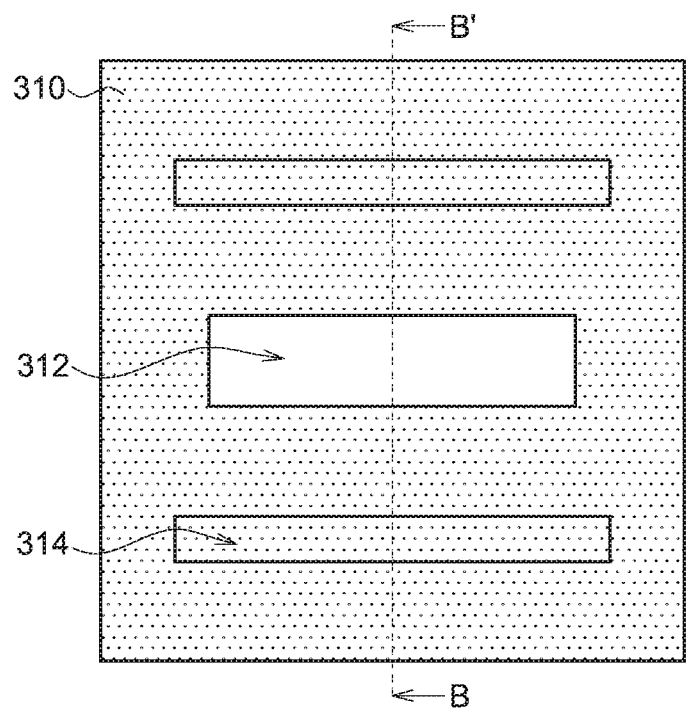
Figure 7B:
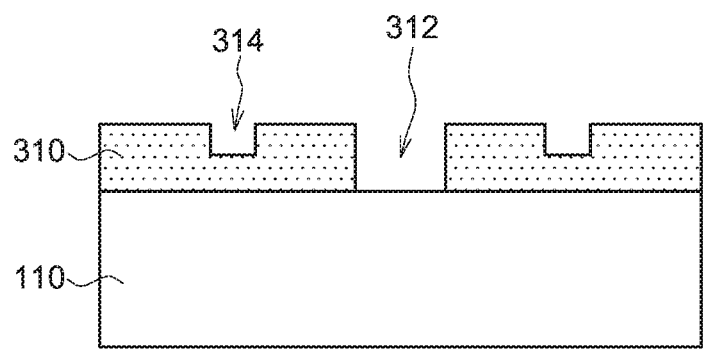
Figure 8A:
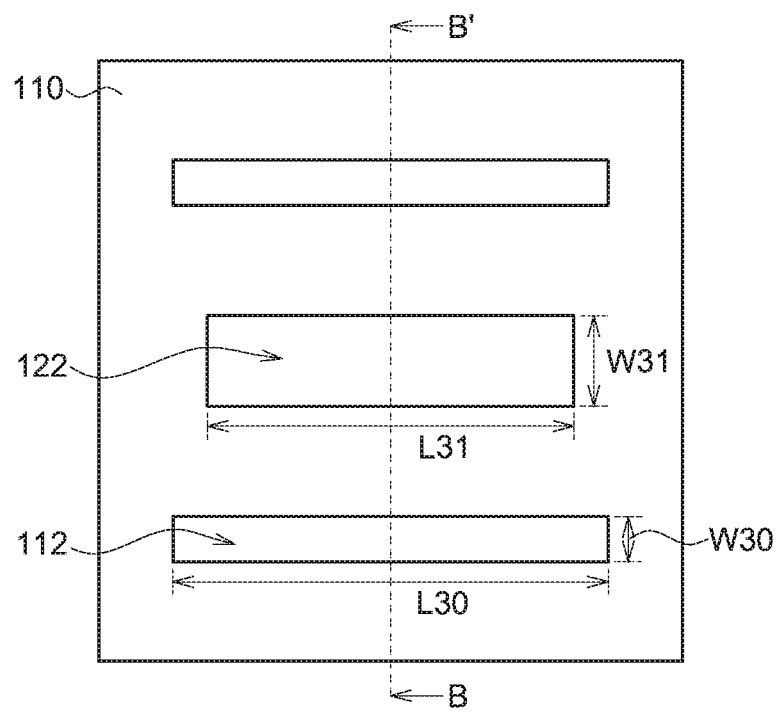
Figure 8B:
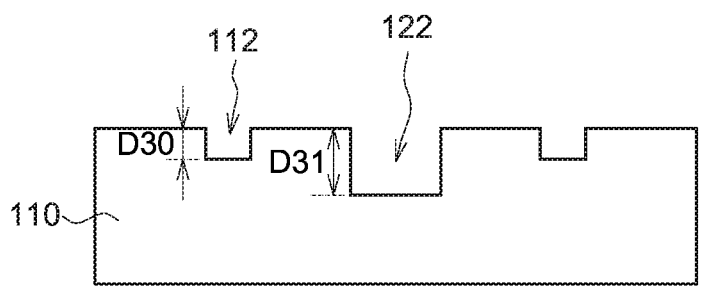

More specifically, referring to FIGS. 6A-6B, a first photoresist layer 310 may be formed on the substrate 110. Then, a first set of patterns corresponding to the first feature 122 and the assist features 112 is transferred onto the first photoresist layer 310 using the first mask 210, as shown in FIGS. 7A-7B. The opening 312 is formed through the first pattern 212 of the first mask 210. The openings 314 are formed through the assist feature patterns 214 of the first mask 210. Referring to FIGS. 8A-8B, the first photoresist layer 310 is etched to form the first feature 122 and the assist features 112. Then, the first photoresist layer 310 is removed. The assist features 112 have a length L30, a width W30, and a depth D30. The first feature 122 has a length L31, a width W31, and a depth D31.

Referring back to FIG. 5, in step S34, the two second features 124 are formed in the desired locations for the two second features 124 using a second mask 220 as shown in FIG. 3B.

Figure 9A:
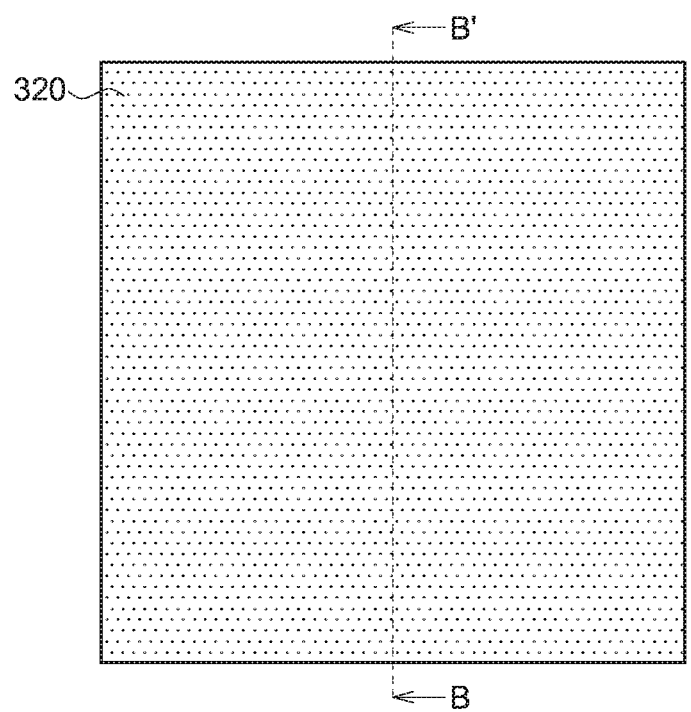
Figure 9B:
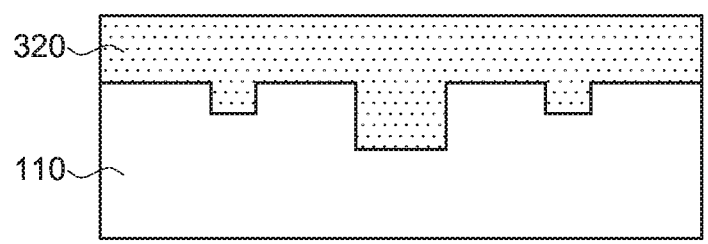
Figure 10A:
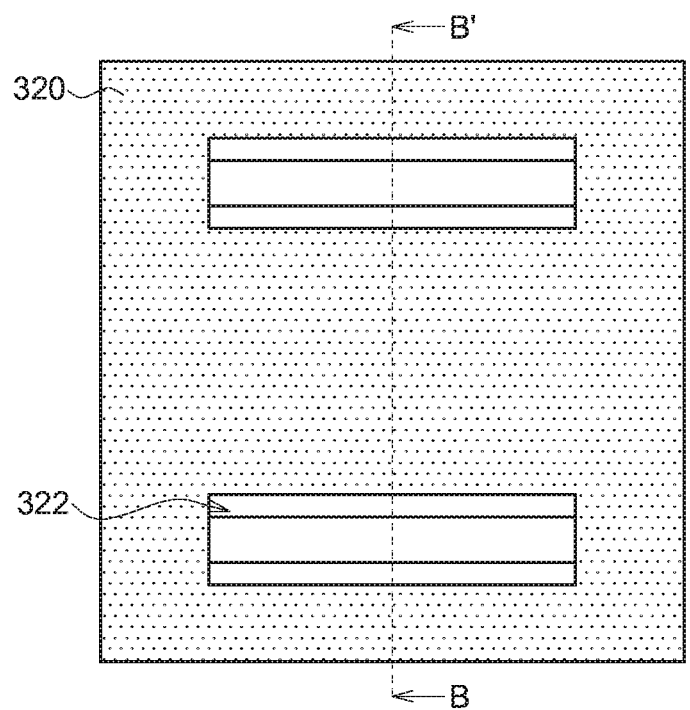
Figure 10B:
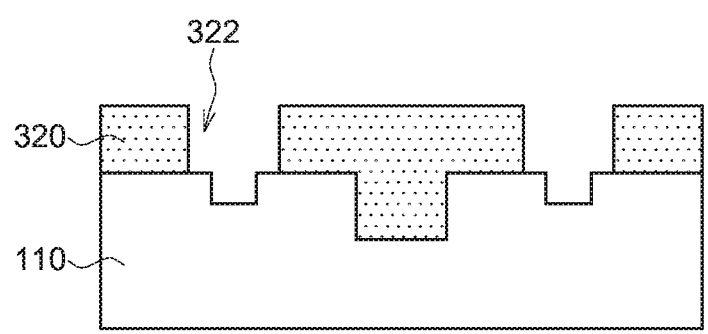
Figure 11A:
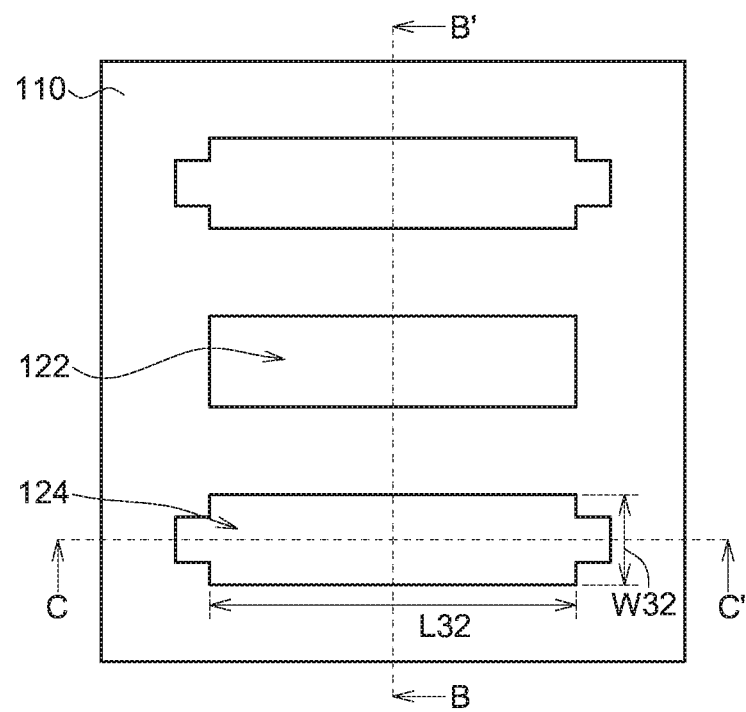
Figure 11B:
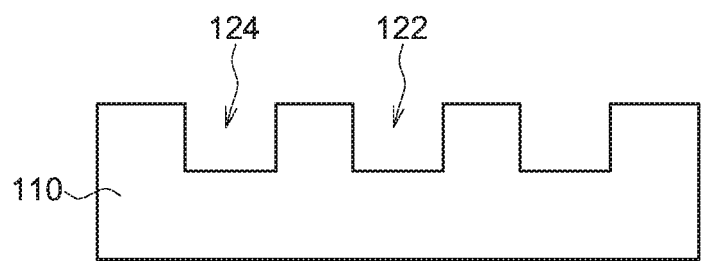

More specifically, referring to FIGS. 9A-9B, a second photoresist layer 320 may be formed on the substrate 110. Then, a second set of patterns corresponding to the second features 124 is transferred onto the second photoresist layer 320 using the second mask 220, as shown in FIGS. 10A-10B. The openings 322 are formed through the second patterns 222 of the second mask 220. Referring to FIGS. 11A-11B, the second photoresist layer 320 is etched to form the second features 124. The second features 124 have a length L32, a width W32, and a depth D32, which are substantially the same as the length L31, the width W31, and the depth D31 of the first feature 122.

Figure 11C:
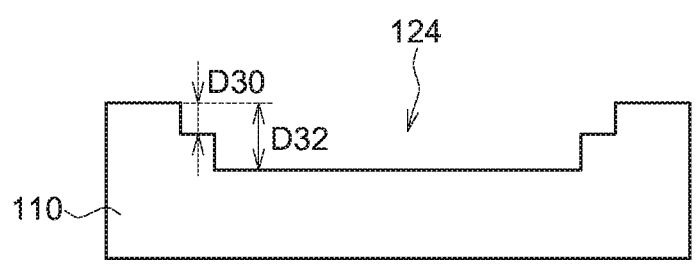

In some embodiments, as shown in FIG. 11A, the length L30 (indicated in FIG. 8A) of the assist features 112 is larger than the length L32 of the second features 124. In some embodiments, as shown in FIG. 11A, the width W30 (indicated in FIG. 8A) of the assist features 112 is smaller than the width W32 of the second features 124, such as about ¼ to ½ of the width W32. In some embodiments, as shown in FIG. 11C, the depth D30 of the assist features 112 is smaller than the depth D32 of the second features 124. It is contemplated that, in some embodiments, the length L30, the width W30, and the depth D30 of the assist features 112 can be in the permissible verifying ranges of the length L32, the width W32, and the depth D32 of the second features 124. This is beneficial for preventing degradation of the function of the second features 124.

The features (122 and 124) formed on the substrate 110 extend along a first direction (D1) and are arranged along a second direction (D2) different from the first direction (D1), such as perpendicular to the first direction (D1).

Figure 12A:
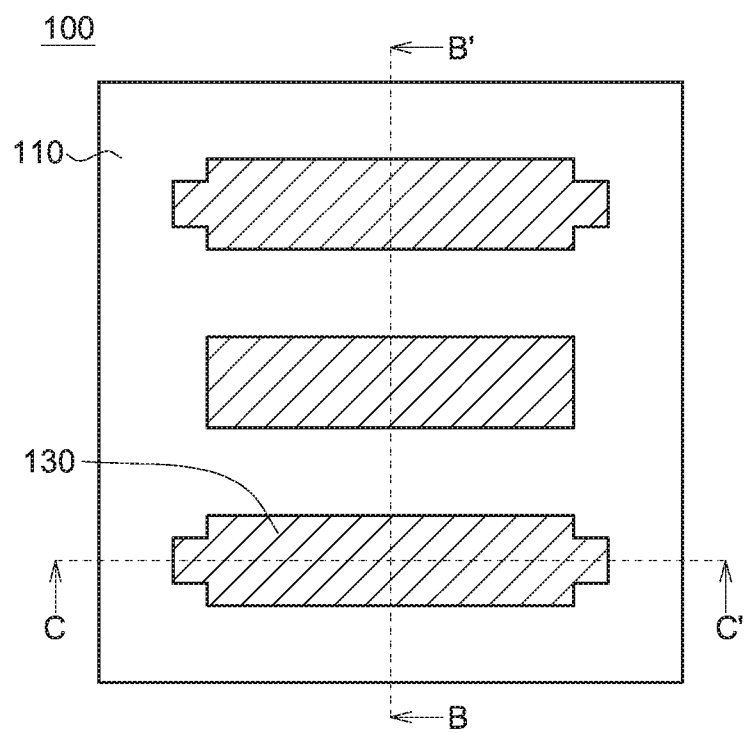
Figure 12B:
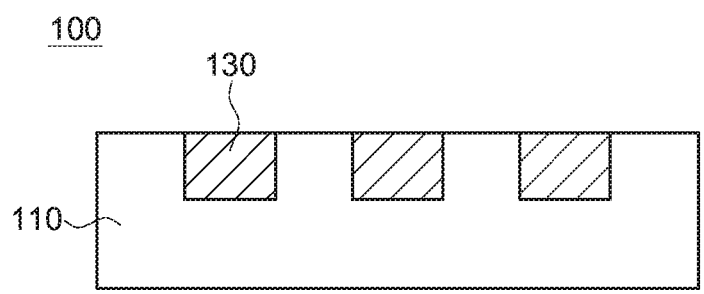
Figure 12C:
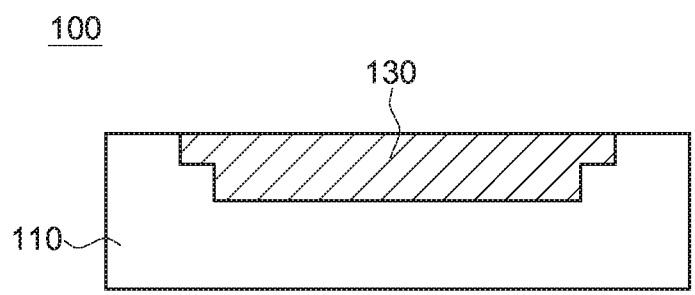

In a situation in which the features 120 are trenches as illustrated here, after forming the trenches, a conductive material 130 may be further filled into the trenches, as shown in FIGS. 12A-12C. As such, conductive structures, such as conductive lines, can be formed.

It is contemplated that other manufacturing processes typical in the related field may also be performed as needed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for generating masks for manufacturing of a semiconductor structure, comprising:
    providing a design pattern for features to be formed on a substrate to a processor;
    dividing the design pattern into a first set of patterns and a second set of patterns by the processor, wherein the first set of patterns comprises a first pattern corresponding to a first feature of the features to be formed, the second set of patterns comprises two second patterns corresponding to two second features of the features to be formed, and the first feature will be arranged between the two second features when the features are formed on the substrate;
    adding two assist feature patterns into the first set of patterns by the processor, wherein the two assist feature patterns are arranged in locations corresponding to the two second features, respectively;
    generating a first mask based on the first set of patterns with the assist feature patterns by the processor; and
    generating a second mask based on the second set of patterns by the processor.

2. The method according to claim 1, wherein a length of the assist feature patterns is larger than a length of the first pattern.

3. The method according to claim 1, wherein a width of the assist feature patterns is smaller than a width of the first pattern.

4. The method according to claim 3, wherein the width of the assist feature patterns is ¼ to ½ of the width of the first pattern.

5. The method according to claim 1, further comprising:
    before generating the first mask, performing an optical proximity correction process to the first set of patterns by the processor; and
    before generating the second mask, performing an optical proximity correction process to the second set of patterns by the processor.

6. A method for manufacturing a semiconductor structure, comprising:
    forming features on a substrate, comprising:
        dividing the features to be formed into a first set of features and a second set of features, wherein a first feature of the first set of features is arranged between two second features of the second set of features;

forming the first feature in a desired location for the first feature and forming two assist features in desired locations for the two second features, respectively, using a first mask; and forming the two second features in the desired locations for the two second features using a second mask.

7. The method according to claim 6, wherein a length of the assist features is larger than a length of the second features.

8. The method according to claim 6, wherein a width of the assist features is smaller than a width of the second features.

9. The method according to claim 8, wherein the width of the assist features is ¼ to ½ of the width of the second features.

10. The method according to claim 6, wherein a depth of the assist features is smaller than a depth of the second features.

11. The method according to claim 6, wherein the features formed on the substrate extend along a first direction and are arranged along a second direction perpendicular to the first direction.

12. The method according to claim 6,
wherein forming the first feature and the assist features comprises:
  transferring a first set of patterns corresponding to the first feature and the assist features onto a first photoresist layer on the substrate using the first mask; and
  etching the first photoresist layer to form the first feature and the assist features; and
wherein forming the second features comprises:
  transferring a second set of patterns corresponding to the second features onto a second photoresist layer on the substrate using the second mask; and
  etching the second photoresist layer to form the second features.

13. The method according to claim 6, wherein the features are trenches, and the method further comprises:
  after forming the trenches, filling a conductive material into the trenches.

* * * * *